US007284210B2

(12) United States Patent
Baumgartner et al.

(10) Patent No.: US 7,284,210 B2
(45) Date of Patent: Oct. 16, 2007

(54) METHOD FOR RECONFIGURATION OF RANDOM BIASES IN A SYNTHESIZED DESIGN WITHOUT RECOMPILATION

(75) Inventors: Jason Raymond Baumgartner, Austin, TX (US); Ali S. El-Zein, Austin, TX (US); Daniel Scott Heller, Austin, TX (US); Wolfgang Roesner, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 435 days.

(21) Appl. No.: 11/050,232

(22) Filed: Feb. 3, 2005

(65) Prior Publication Data

US 2006/0190867 A1    Aug. 24, 2006

(51) Int. Cl.
*G06F 17/50* (2006.01)
(52) U.S. Cl. ............... 716/3; 716/4; 716/5; 716/18
(58) Field of Classification Search ............ 716/3–5, 716/18; 703/13–17
See application file for complete search history.

(56) References Cited

U.S. PATENT DOCUMENTS 6,363,515 B1 * 3/2002 Rajgopal et al. ............ 716/5

| 7,080,333 | B1 * | 7/2006 | Ratchev et al. | 716/5 |
| 7,210,109 | B2 * | 4/2007 | Caron et al. | 716/4 |
| 2005/0198597 | A1 * | 9/2005 | Zhu et al. | 716/4 |
| 2006/0248484 | A1 * | 11/2006 | Baumgartner et al. | 716/3 |

* cited by examiner

*Primary Examiner*—Paul Dinh
(74) *Attorney, Agent, or Firm*—Casimer K. Salys; Dillon & Yudell LLP

(57) ABSTRACT

A method, system and computer program product for performing testing and verification is disclosed. The method includes converting a bias data specification to a driver specification. The driver specification is then parsed into a base constraint and bias file, wherein the base constraint and bias file is suitable for conversion into one of a set comprising a netlist representation and a random simulation representation. A verification framework is selected from among a set comprising a random verification framework using the random simulation representation and a synthesized verification framework using the netlist representation. In response to selecting the random verification framework using the random simulation representation, the random simulation representation is compiled into a parameter database. In response to selecting the synthesized verification framework using the netlist representation, the netlist representation is compiled into a synthesized model. A property of at least one of a set of the synthesized model and the parameter database is tested and verified.

20 Claims, 2 Drawing Sheets

METHOD FOR RECONFIGURATION OF RANDOM BIASES IN A SYNTHESIZED DESIGN WITHOUT RECOMPILATION

BACKGROUND OF THE INVENTION

1. Technical Field

The present invention relates in general to testing and verification, and in particular to verification of digital designs. Still more particularly, the present invention relates to a system, method and computer program product for verification of digital designs through reconfiguration of random biases in a synthesized design without recompilation.

2. Description of the Related Art

With the increasing penetration of processor-based systems into every facet of human activity, demands have increased on the processor and application-specific integrated circuit (ASIC) development and production community to produce systems that are free from design flaws. Circuit products, including microprocessors, digital signal and other special-purpose processors, and ASICs, have become involved in the performance of a vast array of critical functions, and the involvement of microprocessors in the important tasks of daily life has heightened the expectation of error-free and flaw-free design. Whether the impact of errors in design would be measured in human lives or in mere dollars and cents, consumers of circuit products have lost tolerance for results polluted by design errors. Consumers will not tolerate, by way of example, miscalculations on the floor of the stock exchange, in the medical devices that support human life, or in the computers that control their automobiles. All of these activities represent areas where the need for reliable circuit results has risen to a mission-critical concern.

In response to the increasing need for reliable, error-free designs, the processor and ASIC design and development community has developed rigorous, if incredibly expensive, methods for testing and verification for demonstrating the correctness of a design. The task of hardware verification has become one of the most important and time-consuming aspects of the design process. In order to maximize the verification coverage attainable with the resources available to a hardware design, numerous verification methods have been developed, each with their own strengths and weaknesses. These methods include random simulation, hardware emulation, formal verification, and semi-formal verification.

The benefit of random simulation is that it may readily be deployed to attempt to find bugs in large designs, and may be run on any computer from a laptop to a workstation. A drawback of random simulation lies in the limited coverage attainable with such an "explicit search" paradigm, and that it becomes slower as the design size increases. Typically, the stimulus provided to the design in such an environment is through a high-level language which accepts some specification indicating how to generate random stimulus. The high-level specification code interprets the specification to determine how to inject values to drive the simulation process. Example high-level languages include C/C++, or SystemVerilog.

Hardware emulation environments are similar to random simulation environments in the sense that they explicitly search only one path of the design at a time (and hence have limited coverage), though they are often orders of magnitude faster in their evaluation of the design, particularly for very large designs. To enable increased speed, C/C++ interfaces are often discarded in favor of synthesized versions of the random stimulus specification.

Formal and semi-formal verification environments leverage symbolic evaluation of the design to consider astronomically large number of search paths in parallel. In some cases, formal and semi-formal verification environments are able to even complete proofs of correctness of the design, and may yield much greater coverage than random simulation or emulation environments. However, symbolic evaluation through formal and semi-formal verification environments is computationally expensive and may prove inapplicable to larger designs. To enable the symbolic search, C/C++ interfaces are discarded in favor of synthesized versions of the random stimulus specification (as with emulation environments).

These distinct verification methodologies all require that the verification engineer develop a specification for the manner in which random stimulus may be applied to the design under test. Note that there are two aspects to such a specification. First, the "constraining" aspect, which disallows "illegal" stimulus from being applied to the design and causes "false failures" must be considered in all platforms. Second, the "bias" aspect, which indicates the probability with which certain random values will be applied to the design under verification, is most important to simulation, emulation, and semi-formal frameworks. Simulation, emulation, and semi-formal frameworks are dependent upon random explicit search to expose interesting regions of behavior of the design under test. Purely formal algorithms will ignore such biases since they are (by construction) exhaustive and explore all possible stimulus.

Hitherto, the languages used to specify the "constraint" and "bias" aspects of random stimulus to be applied in the verification process (hereafter referred to as the "driver" and the "bias data", respectively) are different in random simulation versus emulation/formal/semi-formal environments, because the former often use C/C++ interpreters whereas the latter require synthesis of this data into a netlist type of representation. The need for multiple file types creates problems by increasing the amount of manual effort needed in the overall verification process (since equivalent specifications may need to be created in two different languages), and adds risk of omissions, errors, etc. Under the prior art, a single shared specification cannot directly be used in both platforms. What is needed is method and computer program product for verification of digital designs through reconfiguration of random biases in a synthesized design without recompilation.

SUMMARY OF THE INVENTION

A method, system and computer program product for performing testing and verification is disclosed. The method includes converting a bias data specification to a driver specification. The driver specification is then parsed into a base constraint and bias file, wherein the base constraint and bias file is suitable for conversion into one of a set comprising a netlist representation and a random simulation representation. A verification framework is selected from among a set comprising a random verification framework using the random simulation representation and a synthesized verification framework using the netlist representation. In response to selecting the random verification framework using the random simulation representation, the random simulation representation is compiled into a parameter database. In response to selecting the synthesized verification framework using the netlist representation, the netlist representation is compiled into a synthesized model. A property of at least one of a set of the synthesized model and the parameter database is tested and verified.

BRIEF DESCRIPTION OF THE DRAWINGS

The novel features believed characteristic of the invention are set forth in the appended claims. The invention itself, however, as well as a preferred mode of use, further objects and advantages thereof, will best be understood by reference to the following detailed descriptions of an illustrative embodiment when read in conjunction with the accompanying drawings, wherein:

DETAILED DESCRIPTION OF THE PREFERRED EMBODIMENT

The present invention enables the same specification to be used for both drivers and bias data files across all platforms, decreasing overall verification resources. In particular, the present invention facilitates the synergistic reuse of a driver specification for reducing the resource commitments inherent in testing and verification of a digital design. The benefit of this approach is that it enables testing time and resource reductions far exceeding those possible in the prior art. The result of the present invention is drastic savings in computational resources for the verification process, enabling design flaws to be exposed and proofs to be completed that otherwise would be unfeasible.

Figure 1:
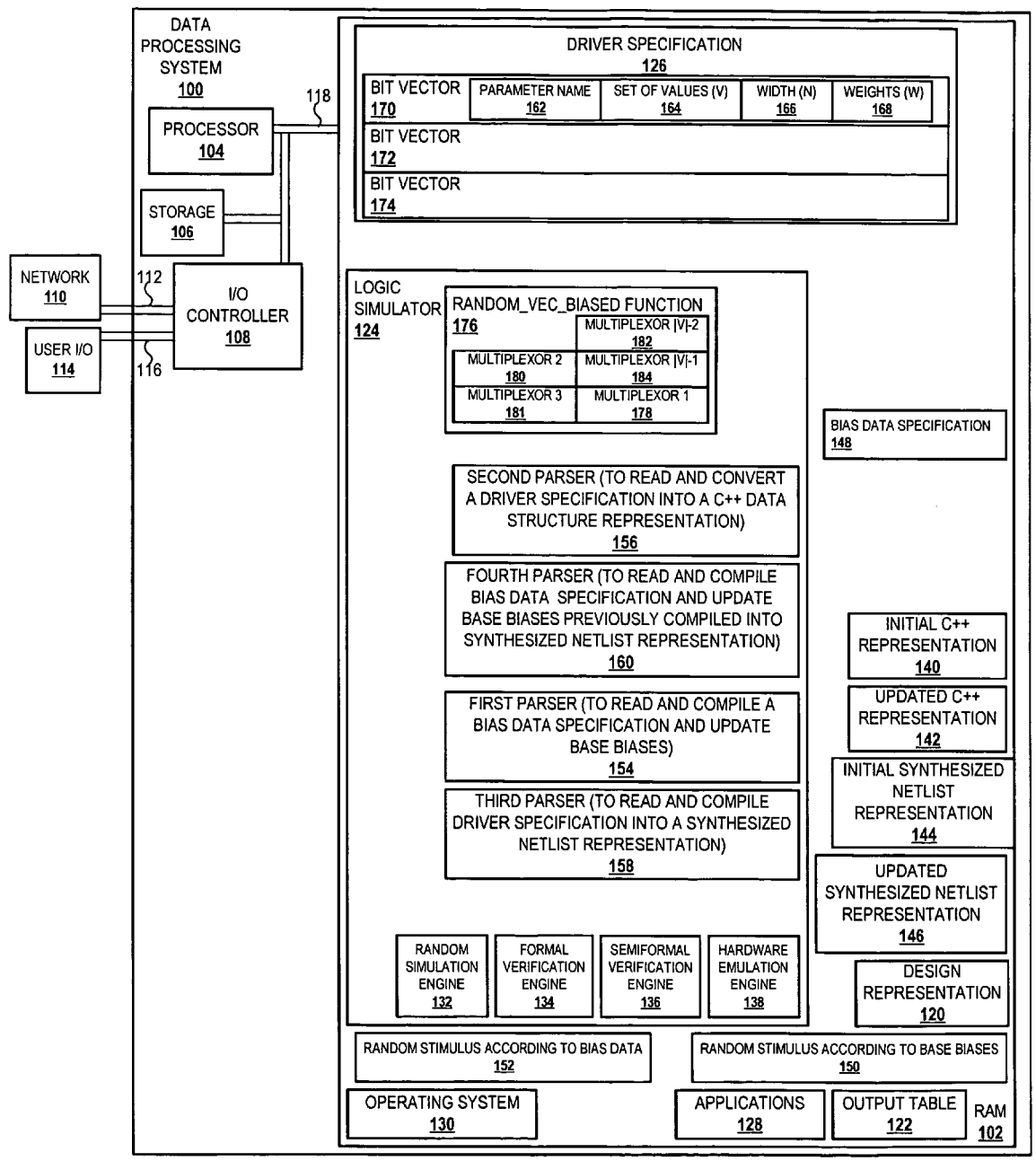
FIG. 1 depicts a block diagram of a data processing system equipped with a computer program product for verification of digital designs through reconfiguration of random biases in a synthesized design without recompilation in accordance with a preferred embodiment of the present invention.

With reference now to the figures, and in particular with reference to FIG. 1, a block diagram of a data processing system equipped with a computer program product for verification of digital designs through reconfiguration of random biases in a synthesized design without recompilation in accordance with a preferred embodiment of the present invention, is depicted. A data processing system 100 contains a processing storage unit (e.g., RAM 102) and a processor 104. Data processing system 100 also includes non-volatile storage 106 such as a hard disk drive or other direct access storage device. An Input/Output (I/O) controller 108 provides connectivity to a network 110 through a wired or wireless link, such as a network cable 112. I/O controller 108 also connects to user I/O devices 114 such as a keyboard, a display device, a mouse, or a printer through wired or wireless link 116, such as cables or a radio-frequency connection. System interconnect 118 connects processor 104, RAM 102, storage 106, and I/O controller 108.

Within RAM 102, data processing system 100 stores several items of data and instructions, while operating in accordance with a preferred embodiment of the present invention. These items include a design representation 120 and an output table 122, which is a result recording file, for interaction with a logic simulator 124. A driver specification 126 is also stored in RAM 102.

Other applications 128 and logic simulator 124 interface with processor 104, RAM 102, I/O control 108, and storage 106 through operating system 130. One skilled in the data processing arts will quickly realize that additional components of data processing system 100 may be added to or substituted for those shown without departing from the scope of the present invention.

Processor 104 executes instructions from programs, often stored in RAM 102, in the course of performing the present invention. In a preferred embodiment of the present invention, processor 104 executes logic simulator 124. Logic simulator 124 performs one or more of four forms of verification on design representation 120 through the use of random simulation engine 132, formal verification engine 134, semi-formal verification engine 136 and hardware emulation engine 138.

Random simulation engine 132 on logic simulator 124 uses a pair of design driver representations in C++ (or another similar language, usually from the C language family, but one skilled in the art will understand that many interface languages, such as SystemVerilog, are available and usable within the scope of the present invention), an initial C++ representation 140, and an updated C++ representation 142. Both initial C++ representation 140 and updated C++ representation 142 are suitable for random simulation. Similarly, formal verification engine 134, semi-formal verification engine 136 and hardware emulation engine 138 use an initial synthesized netlist 144, which is suitable for formal verification, semi-formal verification, and hardware emulation environments. RAM 102 also contains an updated synthesized netlist 146, which is suitable for use with random evaluation environments such as random simulation engine 132.

Logic simulator 124 relies on bias data contained in a bias data specification 148 and related stimulus data in the form of random stimulus according to base biases 150 and random stimulus according to bias data 152.

Further, the present invention is practiced through the use of four parsers. First parser 154 is a parser to read and compile a bias data specification and update base biases. Second parser 156 is a parser to read and convert a driver specification into a C++ data structure representation, generating a C++ representation suitable for random simulation such as initial C++ representation 140. Third parser 158 is a parser to read and compile a driver specification into a synthesized netlist representation, generating a synthesized netlist representation suitable for formal and semiformal verification environments and hardware emulation environments, such as initial synthesized netlist representation 144. Fourth parser 160 is a parser to read and compile a bias data specification and update base biases previously compiled into a synthesized netlist representation, resulting in a synthesized netlist representation that will allow any random evaluation performed on the resulting representation to generate random stimulus according to bias data, such as updated synthesized netlist representation 146.

Second Parser 156 reads and converts a driver specification 126, including base biases for random logic, into initial C/C++ data structure representation 140, which is suitable for random simulation. Any random simulation performed on the resulting representation will generate random stimulus according to the base biases 150.

First parser 154 reads and compiles a bias data specification 148 and updates base biases previously compiled into initial C/C++ representation 140 to generate updated C/C++ representation 142, any random simulation performed on updated C/C++ representation 142 will generate random stimulus according to bias data 152.

Third Parser 158 reads and compiles driver specification 126, including base biases for random logic, into initial synthesized netlist representation 144, which is suitable for formal and semi-formal verification environments and hardware emulation environments. Any random evaluation performed on the resulting representation will generate random stimulus according to base biases 150.

Fourth parser 160 reads and compiles a bias data specification 148, and updates base biases previously compiled into initial synthesized netlist representation 144 to generate updated synthesized netlist representation suitable for random evaluation environments 146. Any random evaluation performed on updated synthesized netlist representation suitable for random evaluation environments 146 will generate random stimulus according to the bias data 152.

Logic simulator 124 records results to output table 122. Logic simulator 124 may also report the contents of output table 122 or selected indicators of the status of design representation 120 to user I/O 114 or applications 128. Additionally, all or part of the data structures discussed above may, at times, be stored in storage 106.

The present invention provides a method to enable the same specifications for drivers and bias data, driver specification 126 and bias data specification 148 respectively, to be used across random simulation, as well as formal/semi-formal/emulation environments. In C/C++ verification frameworks, random stimulus is applied to a design, such as design representation 120, by logic simulator 124 making system calls to random number generators within processor 104, and then decoding an obtained random number via driver specification 126 and/or bias data specification 148 to determine what stimulus to inject to the simulation process. In contrast, for synthesized netlist representations, such as initial synthesized netlist representation 144, logic simulator 124 will include certain "random" gates whose semantics are assumed by the verification environment to be unconstrained sources of boolean 0 and 1 values, which are attributed with bias data to control the probability of driving 0 versus 1.

Note that the verification coverage attained by explicit-search frameworks may often heavily depend upon the stimulus provided by the "random" gates. For example, if a "random" gate represents a "reset" signal to the design, which brings the design back to its initial state, if one toggles such a gate every 2nd time-step on average (i.e., drives the node to '1' with a 50% probability), the verification framework will effectively never explore a sequence where this node is a 0 for thousands of consecutive time-steps, which may prevent the exploration of certain "deep" execution sequences of the design. However, it may be desired to occasionally toggle such an input to ensure that bugs which require such toggling may be exposed, hence the gate must exhibit some randomness. For this reason, the present invention provides a bias data specification 148 to be able to specify a "bias" for random gates.

In order to achieve the highest possible coverage, numerous verification runs may be performed, each where each verification run uses different random seed to enable a different sequence of values to the random gates. Additionally, it is often beneficial to vary the biases of random gates between runs via multiple instances of bias data specification 148 to more significantly alter the nature of the random stimulus. It is also often desired to enable the application or bias data files to alter random biases from their base biases (defined in driver specification 126) instead of requiring changes directly to driver specification 126, to avoid unnecessary bottlenecks in the verification flow.

Such needs to alter the nature of random stimulus can include the typical need to compile driver specification 126 (and the overall compilation process may be lengthy), whereas the compiled driver specification 126 may be of a format whereby application of a bias data specification 148 can be performed quickly upon loading the compiled driver specification 126 into logic simulator 124 without any recompilation. There is a need in such cases to audit changes to driver specification 126, because altering the set of possible stimulus may alter the pass/fail nature of the overall verification problem.

The need to alter the nature of random stimulus can also include the need to alter bias data specification 148 without altering the set of possible random stimulus (only the probability of generating a given set of stimulus). This latter operation is unlike altering driver specification 126, because there is no need to "audit" changes to bias data specification 148 for formal analysis.

Within driver specification 126 random variables are created as bit-vectors 170-174, and each bit vector is composed of a parameter name 162, a set of values (V) 164, a width (N) 166, and a weights (W) 168. Extensions to define single random bits, random integers, etc. are straight-forward as instances/decodings of random bit-vectors. Parameter name 162 provides an identifier that can be used to identify bit-vector 170 when applying bit-vector 170 to a bias data specification 148. Set of values (V) 164, which bit-vector 170 is allowed to take, is a subset of all possible $2^N$ values. Weights (W) 168 provide, for each values 164, a representation of the base probability with which the corresponding value is to be generated by logic simulator 124.

As an example, consider bit-vector 170 as containing a 5-bit random vector (i.e. width (N)=5) with parameter name 162 VEC1, which is allowed to take values b"00000", b"00001", b"00010", or b"11111". Assume it is desired that values b"00000" and b"00001" be explored by the logic simulator 124 with equal probability, and that b"00010" be chosen twice as frequently as b"00000" or b"00001", and that b"11111" be chosen very rarely, e.g., 1/1000th as often as b"00000" or b"00001". One could then ascribe weights (W) 168 of 1000 for both b"00000" and b"00001", a weight (W) 168 of 1 for b"11111", and a weight (W) 168 of 2000 for b"00010". The probability of driving a given value is equal to its weight (W) 168 divided by the sum of the weights (W) 168 of all legal values. In a preferred embodiment, an examplary driver specification 126 encoding of this data will result in the following form:

```
VEC1 = {5, // width
// <value, weight> pairs
{0x0,       1000 }
{0x1,       1000 }
{0x2,       2000 }
{0x1F,      1    }
};
```

When read in and processed by a C/C++ based verification environment such as random simulation engine 132 in logic simulator 124, the resulting data could be represented in numerous ways due to the flexibility of such platforms (e.g., hash tables, linked lists, etc). Note that the example above is provided in legal C syntax, defining VEC1 to be a Parameter structure defined as follows:

```
typedef struct Value_Weights {
    unsigned value;
    unsigned weight; } Value_Weight;
typedef struct Parameter {
    unsigned width;
    Value_Weights values[ ];} Parameter;
```

Hence, a file such as the example describe above could be directly compiled by a C compiler. Alternatively, the driver could be read in by a separate parser to manipulate it into any number of desired formats. However, when read in and processed by a synthesis-based verification environment, such as formal verification engine 134 in logic simulator 124, special treatment is needed, specifically the need to ultimately synthesize the corresponding parameter file into a netlist, such as initial synthesized netlist representation 144. In a preferred embodiment, synthesizing the corresponding parameter file into a netlist is addressed by preprocessing driver specification 126 to convert it to legal HDL in initial synthesized netlist representation 144 using a HDL function to synthesize semantically-correct random logic to implement the desired value-weights selection process. Note that the example below will use VHDL. In a preferred embodiment, a random_vec_biased function 176 takes the following arguments:

```
constant width              : natural;
constant value_weight_table : value_bias_int_array_type:
constant name               : string
``` value_bias_int_array_type is in turn defined as follows:

```
type value_bias_array_type is array
    (natural range < >) of value_bias_pair;
type value_bias_int_pair is record
value natural;
bias: natural;
end record;
```

A preferred embodiment may then straight-forwardly preprocess the above example driver file into a legal VHDL driver using random_vec_biased, the result of which will appear as follows:

```
random_vec_biased(5,
    (2#00000#, 1000),
    2#00001#, 1000),
    2#000010#, 2000),
    2#11111#, 1)),
    "VEC1");
```

The random_vec_biased function 176 may be implemented with any form of logic which may drive the specified values with the specified probabilities. A preferred embodiment will use a simple multiplexor-based implementation. Given |V| different possible values for the random vector, the preferred embodiment creates |V|-1 random nodes, each acting as the selector of |V|-1 muitiplexors 178-184 and random nodes are created in series.

Multiplexor 1 178 sources the downstream logic of the random vector: i.e., multiplexor 1 178 is the logic gate which behaves as its specification. For data Input 1 of multiplexor 1 178, which is driven to the outputs of multiplexor 1 178 when the selector of multiplexor 1 178 evaluates to 1, the output is the first possible random value. This first possible random value is selected by random node 1, which will have bias equal to the weight 168 of that random value 164 divided by the sum of the weights 168 of all legal values. Data input 0 for multiplexor 1 178 is driven by multiplexor 2 180.

Other multiplexors, such as multiplexor 2 180 through multiplexor |V|-2 182 is selected by random nodes 2 through |V|-2, respectively. As with multiplexor 1 178, data input 1 of multiplexor "i" is the "i"-th possible random value, and data input 0 of multiplexor "i" is driven by muitiplexor "i". The preferred embodiment applies the bias to random node "i" that is equal to the weight 168 of the "i"-th random value, divided by the sum of the weights 168 of legal values "i" through |V|.

Multiplexor |V|-1 184 has data Input 1 driven by legal value |V|-1, and has data input 0 driven by legal value |V|. The selector of Multiplexor |V|-1 184 is driven by random node |V|-1, whose bias is equal to the weights 168 of the "|V|-1"-th legal value divided by the sum of the weights 168 of the "|V|-1"-th and the "|V|"-th values.

Straight-forward analysis will demonstrate that the above-described method correctly synthesizes the specified biased random vector. It is noteworthy that this approach uses |V|-1 random nodes. A log-2 based encoding could also be used to create random logic which is able to drive the same set of values, e.g. where each valuation of the log-2 random nodes selects among one of the possible vector values. While the log-2 based approach requires fewer random nodes, it does not offer the fine-grained control over the individual biases applied to each of the possible vector values.

Applying the above-described synthesis to the above example vector, a preferred embodiment orders the values as b"00000", b"00001", b"00010", and b"11111". Multiplexor 1 178 drives value b"00000" and is selected by a random gate labeled "VEC1.1", which has bias 10001/(1000+1000+2000+1). Multiplexor 2 180 drives value b"0000001", and is selected by a random gate labeled "VEC1.2", which has bias 1000/(1000+2000+1). Multiplexor 3 181 drives value b"00010" on data Input 1 and value b"11111" on data input 0. Multiplexor 3 181 is selected by a random gate labeled as "VEC1.3", which has bias 2000/(2000+1).

The syntax of bias data specification 148 may, in a preferred embodiment, be virtually identical to the above-described syntax of driver specification 126, again encoding the parameter names to override with the updated value-weights pairs. For example, assuming the desire to alter the above example to allow selection of b"00000", b"00001", and b"00010" with equal probability, but the probability of "11111" equal to 0, the bias data file would be represented as follows:

```
VEC1 = { 5, //width
// <value, weight> pairs
{0x0,     1 }
{0x1,     1}
{0x2,     1}
{0x1F,    0}}
```

Importing the above example into a C/C++ framework, the preferred embodiment identifies the chosen data structure used to represent the specification for parameter name VEC1, and alter the weights accordingly, depending on the particular representation. By allowing a simple lookup from a name to the corresponding data structure (e.g., hash-based), and from values to weights (e.g., again hash-based), importation is a straight-forward process.

For a synthesis-based representation, importation is slightly more elaborate because the prior art does not provide the ability to directly use hash for lookup between names, gates, and values. In a preferred embodiment, this problem is solved by first storing in initial synthesized netlist representation 144 (representing the driver), a record of the mapping between the parameter name and the corresponding created random gates, the value to which each random gate corresponds, and the order of random gates with respect to a synthesized multiplexer sequence. Note that synthesized multiplexor sequence is handled by tagging the individual random gates with an increasing number to indicate order (e.g., tagging the random gate to drive value b"00000" as VEC 1.1, the random gate to drive value b"00001" as VEC1.2, etc). The preferred embodiment additionally tags the random gates with the values they synthesize (because logic optimization techniques may otherwise obscure the constants used in the multiplexor construction).

The preferred embodiment also applies bias data specification 148 to override the biases stored when synthesizing the driver specification 126. This override is accomplished in two steps. First, logic simulator 124 validates that the set of values provided in bias data specification 148 are a subset of those defined in the synthesized driver specification 126. If not, an error is reported, because the values are not directly supported in a preferred embodiment (because adding values may alter semantics for formal verification). Any values in the initial synthesized netlist representation 144 that not in the modified bias data specification 148 are assumed to have modified bias of 0. Note that a straight-forward extension of this technique allows reconfiguring the values/mux synthesis itself to allow addition of values, though this extension is not described further herein.

Second, logic simulator 124 determines the order in which values are sensitized through multiplexors in the initial synthesized netlist representation 144 and then over-rides the base using the algorithm described above to synthesize the random_vec_biased function 176. Note that altering the weights of the i-th random gate requires altering the bias of all random gates with higher indices than i.

With the above example, logic simulator 124 identifies that random node "VEC1.1" correlates to value b"00000", and alters the bias of this gate to 1/(1+1+1+0). Logic simulator 124 identifies that random node "VEC1.2" correlates to value b"00001" and alters the bias of this node to 1/(1+1+0). Logic simulator 124 identifies that random node "VEC1.3" correlates first to value b"00010" and then to value b"11111" and alters the bias of this node to 1/(1+0).

Note that in the case of emulation, random gates and biases are often synthesized as pseudo-random number generators and comparator logic, meaning that overriding of biases requires that the compared-to values be reconfigurable. Once the biases have been so altered, the synthesized design may be used by logic simulator 124 as if the altered biases have been so specified at the time of compilation of driver specification 126. Note that no recompilation has been performed to carry out this bias reconfiguration.

Figure 2:
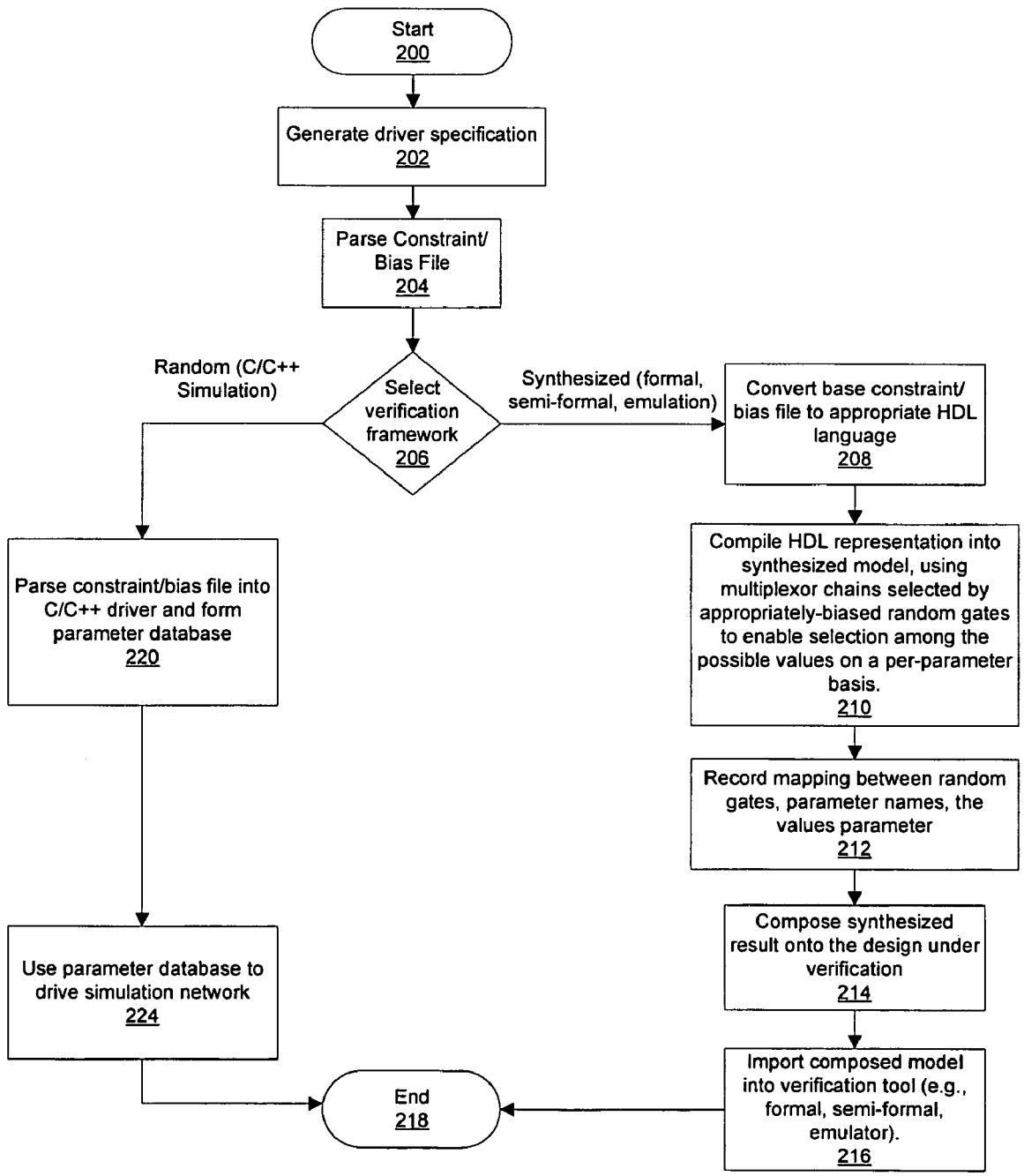
FIG. 2 is a high-level logical flowchart of a process for verification of digital designs through reconfiguration of random biases in a synthesized design without recompilation in accordance with a preferred embodiment of the present invention.

Turning now to FIG. 2, a high-level logical flowchart of a process for verification of digital designs through reconfiguration of random biases in the synthesized design without recompilation in accordance with the preferred embodiment of the present invention is depicted. The process starts at step 200 and then moves to step 202. Step 202 depicts logic simulator 124 generating a driver specification 126. The process next proceeds to step 204, which illustrates logic simulator 124 parsing a constraint and a bias file, such as bias specification 148. The process then moves to step 206.

At step 206, logic simulator 124 selects a verification framework. If a synthesized verification framework is chosen, then the process proceeds to step 208, which depicts logic simulator 124 converting a base constraint and bias file, such as bias specification 148, to an appropriate HDL language. The process then proceeds to step 210. At step 210, logic simulator 124 compiles the HDL representation into a synthesized model, such as initial synthesized netlist representation 144, using multiplexor chains selected by appropriately-biased random gates to enable selection among the possible values on a per-parameter basis. The process then moves to step 212, which illustrates logic simulator 124 recording a mapping between random gates, parameter names and the values parameter, such as driver specification 126. The process then moves to step 214, which depicts logic simulator 124 composing a synthesized result onto the design under verification, such as updated synthesized netlist representation 146. The process then proceeds to step 216. At step 216, logic simulator 124 imports the composed model into a verification tool, such as formal verification engine 134. The process then ends at step 218.

Returning to step 206, if a random verification framework is selected, then the process moves to step 220, which depicts logic simulator 124 parsing a constraint or bias file, such as bias data specification 148 into C/C++ data structure representation and forming a parameter database, such as initial C/C++ data structure representation 140. The process then moves to step 224, which illustrates logic simulator 124 using the parameter database to drive the simulation network. The process then ends at step 218.

While the invention has been particularly shown as described with reference to a preferred embodiment, it will be understood by those skilled in the art that various changes in form and detail may be made therein without departing from the spirit and scope of the invention. It is also important to note that although the present invention has been described in the context of a fully functional computer system, those skilled in the art will appreciate that the mechanisms of the present invention are capable of being distributed as a program product in a variety of forms, and that the present invention applies equally regardless of the particular type of signal bearing media utilized to actually carry out the distribution. Examples of signal bearing media include, without limitation, recordable type media such as floppy disks or CD ROMs and transmission type media such as analog or digital communication links.

What is claimed is:

1. A method for performing verification, said method comprising:

converting a bias data specification to a driver specification;

parsing said driver specification into a base constraint and bias file, wherein said base constraint and bias file is suitable for conversion into one of a set comprising a netlist representation and a random simulation representation;

selecting a verification framework from among a set comprising a random verification framework using said random simulation representation and a synthesized verification framework using said netlist representation;

in response to selecting said random verification framework using said random simulation representation, compiling said random simulation representation into a parameter database;
in response to selecting said synthesized verification framework using said netlist representation, compiling said netlist representation into a synthesized model; and
testing and verifying a property of at least one of a set of said synthesized model and said parameter database.

2. The method of claim 1, wherein said step of converting said bias data specification into a driver specification further comprises converting said bias data specification into a driver specification comprising a parameter name, a set of vector values, a width, and a weight.

3. The method of claim 1, wherein said step of parsing said driver specification into a base constraint and bias file further comprises parsing said driver specification into a base constraint and bias file suitable for conversion into a netlist representation comprising a hardware description language file.

4. The method of claim 1, wherein said step of parsing said driver specification into a base constraint and bias file further comprises parsing said driver specification into a base constraint and bias file suitable for conversion into a random simulation representation comprising a file written in a language from the C language family.

5. The method of claim 1, further comprising composing a synthesized result onto a design under verification to generate an updated synthesized model.

6. The method of claim 5, further comprising importing said updated synthesized model into a simulator.

7. The method of claim 1, wherein said step of testing and verifying said property of said at least one of said set of said synthesized model and said parameter database further comprises employing said parameter database to drive a simulation framework.

8. A system for performing verification, said system comprising:
means for converting a bias data specification to a driver specification;
means for parsing said driver specification into a base constraint and bias file, wherein said base constraint and bias file is suitable for conversion into one of a set comprising a netlist representation and a random simulation representation;
means for selecting a verification framework from among a set comprising a random verification framework using said random simulation representation and a synthesized verification framework using said netlist representation;
means, in response to selecting said random verification framework using said random simulation representation, compiling said random simulation representation into a parameter database;
means, in response to selecting said synthesized verification framework using said netlist representation, compiling said netlist representation into a synthesized model; and
means for testing and verifying a property of at least one of a set of said synthesized model and said parameter database.

9. The system of claim 8, wherein said means for converting said bias data specification into a driver specification further comprises means for converting said bias data specification into a driver specification comprising a parameter name, a set of vector values, a width, and a weight.

10. The system of claim 8, wherein said means for parsing said driver specification into a base constraint and bias file further comprises means for parsing said driver specification into a base constraint and bias file suitable for conversion into a netlist representation comprising a hardware description language file.

11. The system of claim 8, wherein said means for parsing said driver specification into a base constraint and bias file further comprises means for parsing said driver specification into a base constraint and bias file suitable for conversion into a random simulation representation comprising a file written in a language from the C language family.

12. The system of claim 8, further comprising means for composing a synthesized result onto a design under verification to generate an updated synthesized model.

13. The system of claim 12, further comprising means for importing said updated synthesized model into a simulator.

14. The system of claim 8, wherein said means for testing and verifying said property of said at least one of said set of said synthesized model and said parameter database further comprises means for employing said parameter database to drive a simulation framework.

15. A computer program product having a computer program stored in a computer-readable medium and executed by a computer for performing verification, said computer program product comprising:
a computer-readable medium;
instructions on the computer-readable medium for converting a bias data specification to a driver specification;
instructions on the computer-readable medium for parsing said driver specification into a base constraint and bias file, wherein said base constraint and bias file is suitable for conversion into one of a set comprising a netlist representation and a random simulation representation;
instructions on the computer-readable medium for selecting a verification framework from among a set comprising a random verification framework using said random simulation representation and a synthesized verification framework using said netlist representation;
instructions, in response to selecting said random verification framework using said random simulation representation, compiling said random simulation representation into a parameter database;
instructions, in response to selecting said synthesized verification framework using said netlist representation, compiling said netlist representation into a synthesized model; and
instructions on the computer-readable medium for testing and verifying a property of at least one of a set of said synthesized model and said parameter database.

16. The computer program product of claim 15, wherein said instructions for converting said bias data specification into a driver specification further comprises instructions on the computer-readable medium for converting said bias data specification into a driver specification comprising a parameter name, a set of vector values, a width, and a weight.

17. The computer program product of claim 15, wherein said instructions for parsing said driver specification into a base constraint and bias file further comprises instructions on the computer-readable medium for parsing said driver specification into a base constraint and bias file suitable for conversion into a netlist representation comprising a hardware description language file.

18. The computer program product of claim 15, wherein said instructions for parsing said driver specification into a base constraint and bias file further comprises instructions on the computer-readable medium for parsing said driver specification into a base constraint and bias file suitable for conversion into a random simulation representation comprising a file written in a language from the C language family.

19. The computer program product of claim 15, further comprising instructions on the computer-readable medium for composing a synthesized result onto a design under verification to generate an updated synthesized model.

20. The computer program product of claim 19, further comprising instructions on the computer-readable medium for importing said updated synthesized model into a simulator.

* * * * *